(12) United States Patent
Shindo

(10) Patent No.: US 12,094,824 B2
(45) Date of Patent: Sep. 17, 2024

(54) SEMICONDUCTOR PACKAGE AND METHOD FOR MANUFACTURING SEMICONDUCTOR PACKAGE

(71) Applicant: LAPIS Semiconductor Co., Ltd., Yokohama (JP)

(72) Inventor: Masanori Shindo, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 18/301,949

(22) Filed: Apr. 17, 2023

(65) Prior Publication Data

US 2023/0253326 A1     Aug. 10, 2023

Related U.S. Application Data

(62) Division of application No. 16/817,579, filed on Mar. 12, 2020, now Pat. No. 11,664,314.

(30) Foreign Application Priority Data

Mar. 29, 2019    (JP) ................................ 2019-069318

(51) Int. Cl.
     *H01L 21/48*      (2006.01)
     *H01L 23/00*      (2006.01)
     *H01L 23/498*     (2006.01)
     *H01L 23/532*     (2006.01)

(52) U.S. Cl.
CPC .. *H01L 23/53295* (2013.01); *H01L 23/49822* (2013.01); *H01L 24/13* (2013.01); *H01L 2224/11* (2013.01)

(58) Field of Classification Search
CPC ............. H01L 21/4846; H01L 21/4885; H01L 21/563; H01L 24/27; H01L 23/48
See application file for complete search history.

(56) References Cited

U.S. PATENT DOCUMENTS

| 2016/0126173 A1* | 5/2016 | Kim ..................... H01L 23/498 |
| | | 257/738 |
| 2023/0094425 A1* | 3/2023 | Shindo .................... H01L 24/13 |
| | | 257/531 |

OTHER PUBLICATIONS

"Office Action of China Counterpart Application", issued on Jul. 16, 2024, with English translation thereof, p. 1-p. 24.

* cited by examiner

*Primary Examiner* — Michele Fan
(74) *Attorney, Agent, or Firm* — JCIPRNET

(57) ABSTRACT

A foundation portion and a conductive base portion disposed on the foundation portion are formed on a temporary support, a semiconductor element electrically connected to the base portion is disposed on a side of the temporary support on which the foundation portion and the base portion are formed, and an insulating layer coming into a state of burying the foundation portion, the base portion, and the semiconductor element is formed on the temporary support. Subsequently, surfaces of the foundation portion and the insulating layer on a side of the temporary support are exposed by removing the temporary support, and the exposed foundation portion is further removed, thereby disposing the base portion in a state of being more recessed than the surface of the insulating layer. An external connection terminal is formed on the exposed base portion to manufacture the semiconductor package.

3 Claims, 24 Drawing Sheets

SEMICONDUCTOR PACKAGE AND METHOD FOR MANUFACTURING SEMICONDUCTOR PACKAGE

CROSS-REFERENCE TO RELATED APPLICATION

This application is a divisional application of and claims the priority benefit of U.S. application Ser. No. 16/817,579, filed on Mar. 12, 2020, now allowed, which claims the priority benefit of Japan application serial no. 2019-069318, filed on Mar. 29, 2019. The entirety of each of the above-mentioned patent applications is hereby incorporated by reference herein and made a part of this specification.

BACKGROUND

Technical Field

This disclosure relates to a semiconductor package and a method for manufacturing the semiconductor package.

Related Art

A semiconductor package in which a semiconductor chip is sealed with a resin is manufactured through various steps of, for example, forming a thin film by using a semiconductor substrate such as a silicon wafer, forming a circuit pattern by performing repeated patterning and then forming a rewiring, forming an external connection terminal, performing sealing with a resin, or the like. A solder ball is used as the external connection terminal in many cases.

For example, patent literature 1 (Japanese Patent Application Laid-open (JP-A) No. 2011-166072), patent literature 2 (JP-A No. 2014-197711) and patent literature 3 (JP-A No. 2016-66820) disclose a semiconductor apparatus having a configuration in which a rewiring electrically connected to a semiconductor chip is formed in an insulating layer, an underlying metal film that is electrically connected to the rewiring and a barrier metal are stacked at an opening portion of the insulating layer, and a solder ball is further formed as an external connecting metal terminal (external connection terminal) on the barrier metal. It is disclosed that the barrier metal is formed by electrolytic plating with the underlying metal film as a foundation (seed layer), and the solder ball is attached as a metal terminal on the barrier metal.

In addition, patent literature 4 (JP-A No. 2011-146751) discloses a method for manufacturing a semiconductor package in which, after a wiring is formed on a temporary conductive support, a semiconductor element is mounted thereon, and the semiconductor element electrically connected to the wiring is sealed with a resin, the temporary conductive support is removed to expose the wiring, an insulating layer is formed except at a position at which an external connection terminal is to be formed, and the external connection terminal is further formed at a position of the wiring at which the insulating layer is not formed.

In addition, an example of a method for manufacturing a semiconductor package in which a semiconductor chip is sealed with a resin may be a method in which a Cu layer serving as a base portion used for disposing an external connection terminal, an insulating film, a rewiring, and a semiconductor chip are sequentially built on a temporary support such as a glass substrate, mold-sealing is performed with a resin, then the temporary support is removed, a Ni layer (Ni base) is further formed as a base portion of a barrier metal through electroless plating on the Cu layer which is exposed from the insulating layer on a side on which the temporary support is removed, and a solder ball is mounted as the external connection terminal on the Ni base.

In the method in which the temporary support is used as described above, it is possible to stably perform transport or form a film before the temporary support is removed. However, after the temporary support is removed, strength of the device is significantly reduced, and handleability is degraded. Hence, after the temporary support is removed, there is a possibility that a wet process such as electroless plating for forming the Ni layer as the base portion will damage the device. In this respect, for example, improvement of stability and handleability by reattaching the temporary support is considered; however, in this case, it is required to perform an extra process, and manufacturing costs are increased accordingly.

FIG. 24 schematically illustrates an example of a connection part of a base portion and an external connection terminal when a Cu layer (Cu base) 220 serving as the base portion, a rewiring 240, and the like are formed at a predetermined position on a temporary support (not illustrated) as described above, and a Ni layer (Ni base) 222 is further formed by electroless plating on the Cu base 220 which is exposed by removing the temporary support. When the Ni layer (Ni base) 222 is formed as a base portion by electroless plating on the Cu layer 220 after the temporary support is removed, the Ni base 222 is formed in a state that a side surface thereof is exposed from an insulating film 230 and the Ni base is expanded wider than the Cu layer (Cu base) 220 being a foundation. When a solder ball 210 is mounted on and connected to the Ni base 222 expanded wider than the Cu base 220 being a foundation, an effective connection area between the Cu base 220 and the solder ball 210 is small, and there is a possibility that terminal strength will be insufficient.

SUMMARY

The disclosure provides a method for manufacturing a semiconductor package by which it is possible to easily manufacture the semiconductor package including an external connection terminal having high connection strength by using a temporary support and a semiconductor package in which it is possible to increase connection strength of the external connection terminal.

The method for manufacturing a semiconductor package according to the disclosure includes:

a step of forming, on a temporary support, a foundation portion and a conductive base portion disposed on the foundation portion;

a step of disposing a semiconductor element electrically connected to the base portion, on a side of the temporary support on which the foundation portion and the base portion are formed;

a step of forming, on the temporary support, an insulating layer coming into a state of burying the foundation portion, the base portion, and the semiconductor element;

a step of exposing, by removing the temporary support, surfaces of the foundation portion and the insulating layer on a side of the temporary support;

a step of exposing, by removing the exposed foundation portion, the base portion in a state of being more recessed than the surface of the insulating layer; and a step of forming an external connection terminal on the exposed base portion.

The semiconductor package according to the disclosure includes:

an external connection terminal;

a conductive base portion on which the external connection terminal is formed;

a semiconductor element electrically connected to the base portion; and an insulating layer in which the base portion and the semiconductor element are buried; and the base portion is buried in the insulating layer in a state that a surface of the base portion, on which the external connection terminal is formed, is more recessed than a surface of the insulating layer.

DETAILED DESCRIPTION

Figure 1:
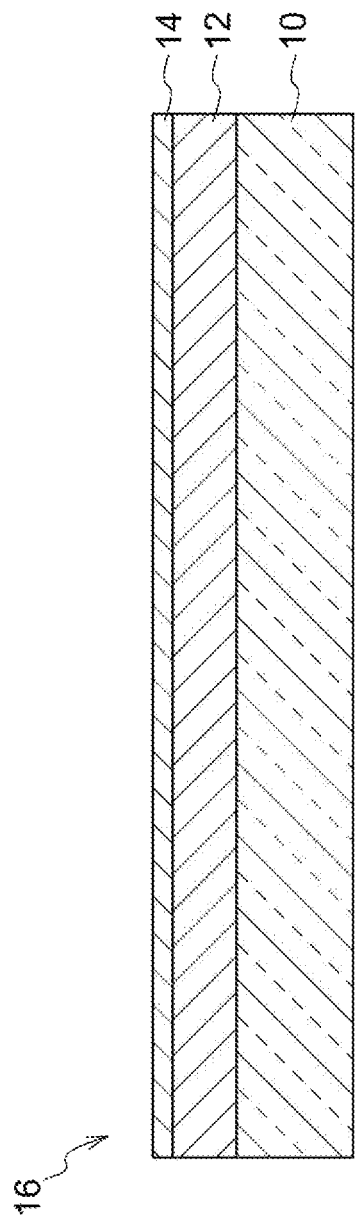
FIG. 1 is a cross-sectional view schematically illustrating an example of a method for manufacturing a semiconductor package according to a first embodiment of the disclosure.

Hereinafter, an embodiment (this embodiment) of the disclosure is described with reference to the drawings. Moreover, in the drawings, the same reference signs are assigned to substantially identical or equivalent structural elements or parts. In addition, in this specification, the word "step" includes not only an independent step, but also a case in which an intended purpose of a step is achieved even when it is not possible to clearly distinguish the step from other steps.

[Method for Manufacturing Semiconductor Package]

First, a method for manufacturing a semiconductor package according to the embodiment is described.

The method for manufacturing a semiconductor package according to the embodiment includes:

a step of forming, on a temporary support, a foundation portion and a conductive base portion disposed on the foundation portion;

a step of disposing a semiconductor element electrically connected to the base portion, on a side of the temporary support on which the foundation portion and the base portion are formed;

a step of forming, on the temporary support, an insulating layer coming into a state of burying the foundation portion, the base portion, and the semiconductor element;

a step of exposing, by removing the temporary support, surfaces of the foundation portion and the insulating layer on a side of the temporary support;

a step of exposing, by removing the exposed foundation portion, the base portion in a state of being more recessed than the surface of the insulating layer; and a step of forming an external connection terminal on the exposed base portion.

The step of forming the insulating layer may include a step of forming, on the temporary support, a first insulating layer coming into a state of burying the foundation portion and the base portion; and a step of forming a second insulating layer coming into a state of burying the semiconductor element, after a step of disposing, on the first insulating layer, the semiconductor element electrically connected to the base portion.

In addition, the step of forming the foundation portion and the base portion on the temporary support may include:

a step of forming a foundation layer for forming the foundation portion on the temporary support;

a step of forming, on the foundation layer, a resist mask having a region for forming the base portion which is open;

a step of forming the base portion in the open region of the resist mask on the foundation layer;

a step of removing the resist mask; and a step of forming the foundation portion by etching, with the base portion as a mask, a region of the foundation layer in which the base portion is not formed.

In addition, the step of forming the foundation portion and the base portion on the temporary support may include a step of forming the base portion by electrolytic plating.

According to the method for manufacturing a semiconductor package of the embodiment, since the foundation portion is formed on the temporary support, and the base portion for forming the external connection terminal is further formed on the foundation portion, there is no need to form the base portion by electroless plating or the like after the temporary support is removed. In addition, according to the method for manufacturing a semiconductor package of the embodiment, by removing the temporary support and removing the foundation portion, a side surface of the base portion is buried in the insulating layer, and the surface of the base portion, on which the external connection terminal is formed, is exposed in the state of being more recessed than the surface of the insulating layer. Hence, there is no need to form an insulating layer again out of a region in which the external connection terminal is formed after removing the temporary support as described in the method disclosed in patent literature 4, the external connection terminal is formed on the base portion after the foundation portion is removed, and thereby it is possible to manufacture a semiconductor package having high terminal strength.

<Method for Manufacturing Semiconductor Package According to First Embodiment>

Hereinafter, an example (first embodiment) of the method for manufacturing a semiconductor package according to the embodiment is described with reference to the drawings.

FIGS. 1 to 15 schematically illustrate an example of the method for manufacturing a semiconductor package according to the first embodiment, respectively. In the first embodiment, the base portion is formed by electrolytic plating, and the first insulating layer in which the base portion is buried and the second insulating layer in which the semiconductor element is buried are formed as the insulating layer.

(Preparation of Temporary Support)

First, the temporary support is prepared. A temporary support 16 used in the embodiment has a configuration in which a temporary fixing layer 12 and a protective layer 14 are stacked on a glass substrate 10 (FIG. 1). Moreover, the temporary support is not limited to the configuration illustrated in FIG. 1 and may have any configuration, as long as the temporary support has stiffness enough to build a main semiconductor package body 100 (refer to FIG. 11) after mold sealing which will be described later, and the temporary support can be removed after the main semiconductor package body is built on the temporary support.

The temporary fixing layer 12 is configured of a material which is decomposed by an ultraviolet laser beam transmitted through the glass substrate 10. For example, a temporary fixing agent is applied and dried on the glass substrate 10 to thereby form the temporary fixing layer 12 having a thickness of about 0.25 μm. After the main semiconductor package body 100 which is described later is built on the temporary support 16, the temporary fixing layer 12 is irradiated with the ultraviolet laser beam from a side of the glass substrate 10, and thereby it is possible to decompose the temporary fixing layer 12 and separate the glass substrate 10 of the temporary support 16 from the main semiconductor package body 100.

The protective layer 14 is configured of a Ti film having a thickness of about 0.15 μm which is formed by sputtering for example. The protective layer 14 is formed on the temporary fixing layer 12 in advance, and thereby it is possible to suppress a damage to the temporary fixing layer 12 in a process of building the main semiconductor package body 100 on the temporary support 16. In addition, when the ultraviolet laser beam is irradiated from the side of the glass substrate 10 to decompose the temporary fixing layer 12 after the main semiconductor package body 100 is built on the temporary support 16, transmission of the ultraviolet laser beam is inhibited by the protective layer 14, and a damage to the main semiconductor package body 100 caused by the ultraviolet laser beam can be suppressed.

(Formation of Foundation Portion)

A seed layer 20 is formed as the foundation portion on the temporary support 16. The seed layer 20 is a layer for energizing when a Ni layer 22 serving as the base portion is formed by electrolytic plating.

Figure 2:
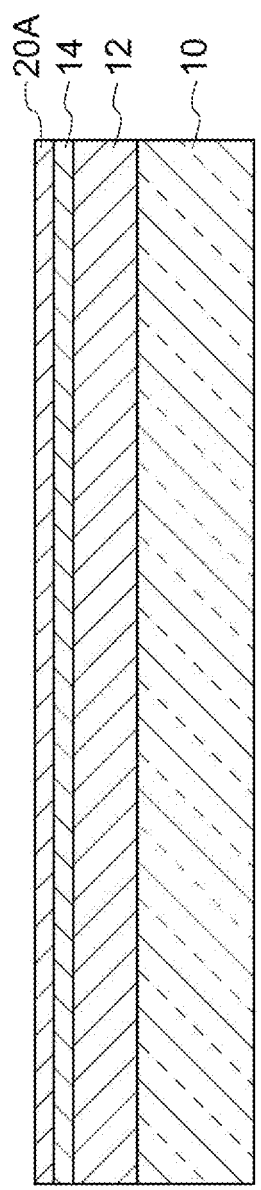
FIG. 2 is a cross-sectional view schematically illustrating an example of the method for manufacturing a semiconductor package according to the first embodiment of the disclosure.

A method for forming the seed layer 20 is not limited, and for example, a Cu layer 20A having a thickness of about 0.3 to 0.6 μm is formed, as a foundation layer for forming the foundation portion 20, by sputter deposition on the entire surface of the temporary support 16 (protective layer 14) (FIG. 2).

Figure 3:
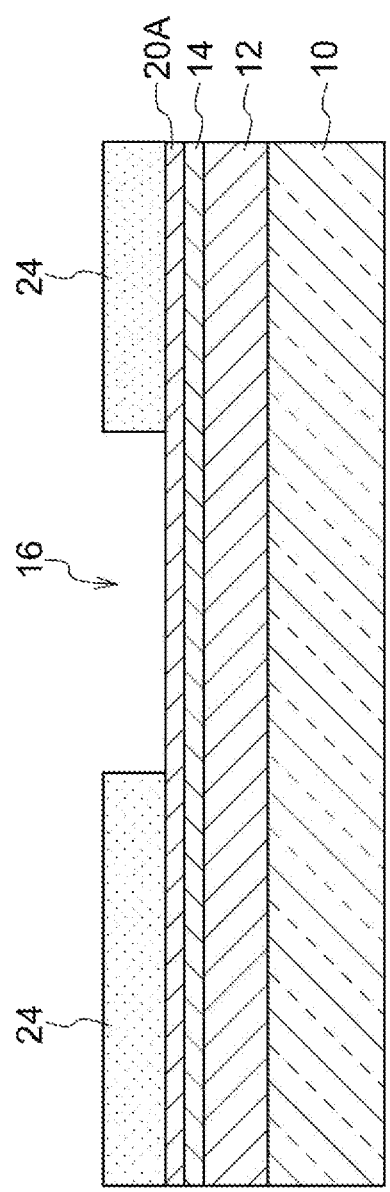
FIG. 3 is a cross-sectional view schematically illustrating an example of the method for manufacturing a semiconductor package according to the first embodiment of the disclosure.

Subsequently, a resist mask 24 is formed on the Cu layer 20A such that a region for forming the base portion 22 is open (FIG. 3). The resist mask 24 may be formed by photolithography. For example, after a photosensitive insulation material is applied on the Cu layer 20A by a spin coat method, patterning is performed by exposure and development, thereby forming the resist mask 24 at a predetermined position on the Cu layer 20A.

(Formation of Base Portion)

Figure 4:
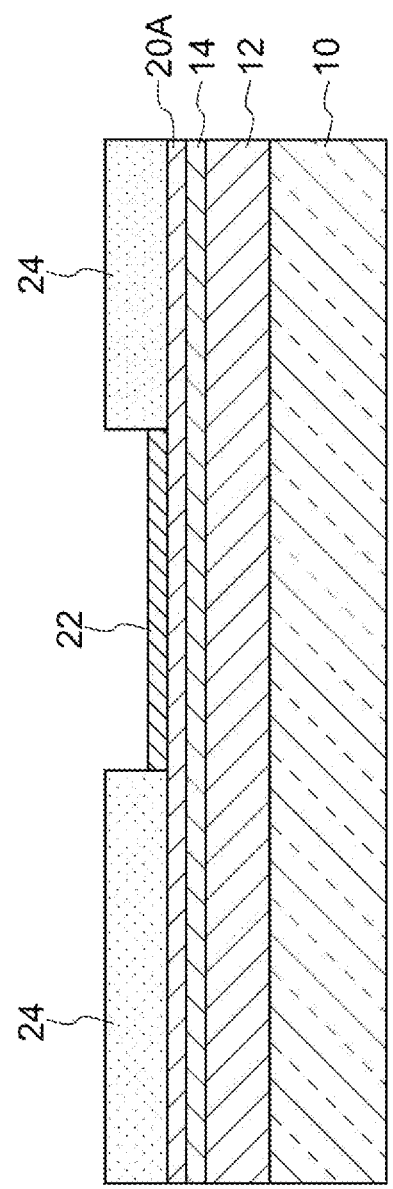
FIG. 4 is a cross-sectional view schematically illustrating an example of the method for manufacturing a semiconductor package according to the first embodiment of the disclosure.

Subsequently, the conductive base portion 22 for forming an external connection terminal 110 (see FIG. 15) which is described later is formed. The base portion 22 functions as a barrier metal suppressing Cu which configures a rewiring 40 from spreading to the external connection terminal 110. As the base portion 22, for example, the Ni layer (Ni base) 22 having a thickness of about 5 μm is formed by electrolytic plating. Specifically, the Cu layer 20A which is exposed from an opening portion 26 of the resist mask 24 is immersed in a plating solution, and a current is supplied to a plating electrode (not illustrated) connected to the seed layer 20A slightly exposed at an outer circumferential portion of a wafer. Consequently, the Ni layer (Ni base) 22 is formed in a region (opening portion) 26 of the Cu layer 20A on which the resist mask 24 is not formed (FIG. 4).

Figure 5:
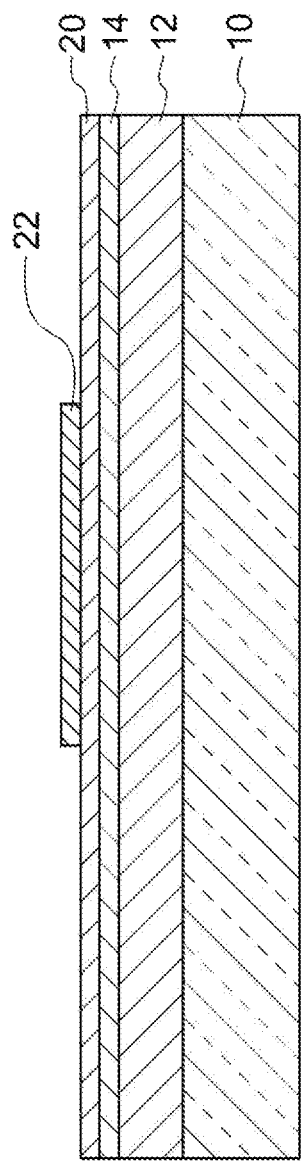
FIG. 5 is a cross-sectional view schematically illustrating an example of the method for manufacturing a semiconductor package according to the first embodiment of the disclosure.

After the Ni base 22 is formed by electrolytic plating, the resist mask 24 is removed using an ashing process, an organic solvent or the like (FIG. 5).

Figure 6:
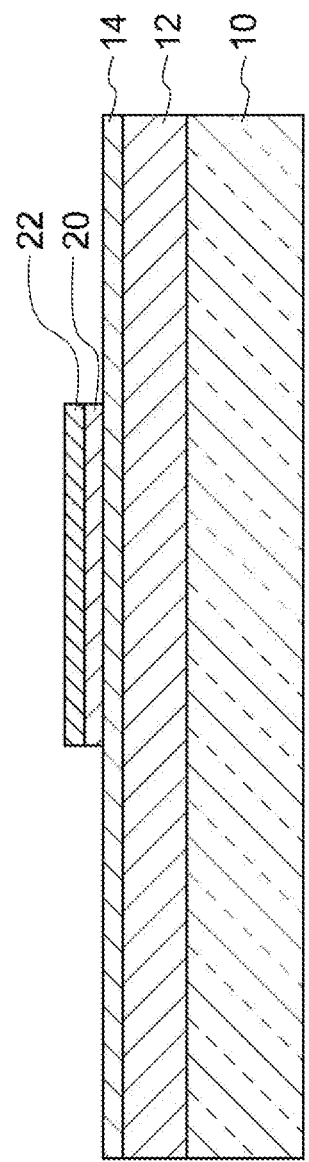
FIG. 6 is a cross-sectional view schematically illustrating an example of the method for manufacturing a semiconductor package according to the first embodiment of the disclosure.

After the resist mask 24 is removed, the region of the Cu layer 20A in which the Ni base 22 is not formed (the part in which the Cu layer 20A is exposed) is removed by etching (FIG. 6). By performing the etching, a part of the Cu layer 20A in which the Ni layer 22 is not formed is removed with the Ni base 22 as a mask, and the foundation portion (seed layer) 20 is formed. Moreover, the protective layer (Ti layer) 14 exposed by removing the region of the Cu layer 20A in which the resist mask 24 is not formed is not etched but remains.

(Formation of First Insulating Layer, Rewiring, and Bonding Electrode)

Figure 7:
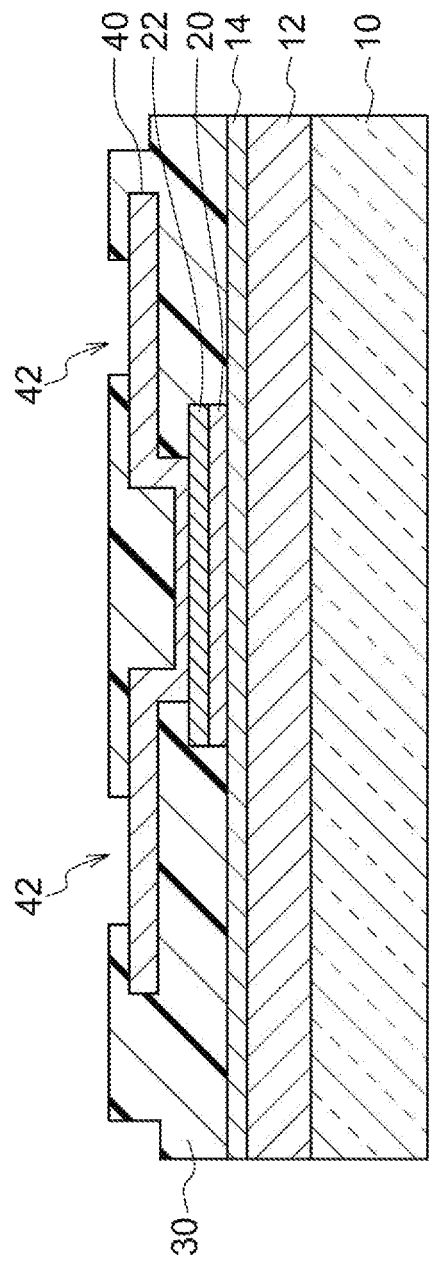
FIG. 7 is a cross-sectional view schematically illustrating an example of the method for manufacturing a semiconductor package according to the first embodiment of the disclosure.

After the Ni layer (Ni base) 22 which becomes the base portion of the external connection terminal 110 is formed, a first insulating layer 30 and the rewiring 40 are formed in a manner that the Ni base 22 and a flip chip 70 (see FIG. 9) to be described later which includes a semiconductor element are electrically connected to each other via the rewiring 40 on the temporary support 16. For example, the first insulating layer 30 and the rewiring 40 are formed in a manner that the foundation portion 20 and the Ni base 22 are buried in the first insulating layer 30 by known photolithography and etching by using polyimide as the first insulating layer 30 and Cu as the rewiring 40, and a part of the rewiring 40 is exposed from an opening portion 42 of the first insulating layer 30 (FIG. 7). In addition, the first insulating layer 30 is in a state of being in contact with the temporary support 16 in a region in which the foundation portion 20 is not formed.

Figure 8:
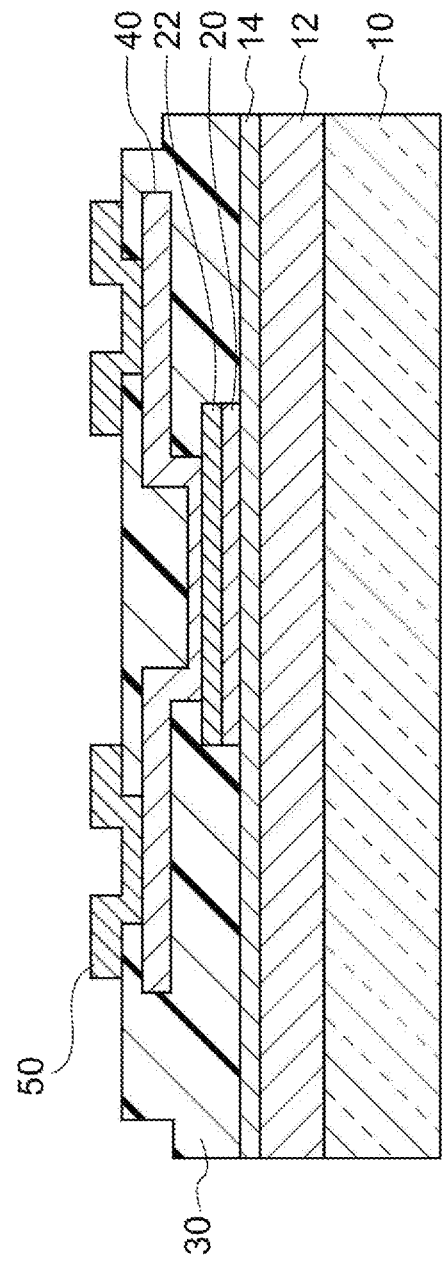
FIG. 8 is a cross-sectional view schematically illustrating an example of the method for manufacturing a semiconductor package according to the first embodiment of the disclosure.

Subsequently, a bonding electrode 50 which is connected to the rewiring 40 is formed at the opening portion 42 of the first insulating layer 30 (FIG. 8). The bonding electrode 50 is formed by metal having an effect of a barrier metal that suppresses spreading of Cu which configures the rewiring 40. For example, the resist mask (not illustrated) is formed by photolithography in a manner that the region in which the bonding electrode 50 is formed is exposed, and a Ni layer having a thickness of, for example, about 5 μm is formed by electrolytic plating. A part of the rewiring 40 which is exposed from the opening portion 42 becomes the seed layer, and the bonding electrode 50 which is connected to the rewiring 40 is formed at the opening portion 42 of the first insulating layer 30.

(Disposition of Semiconductor Element)

Figure 9:
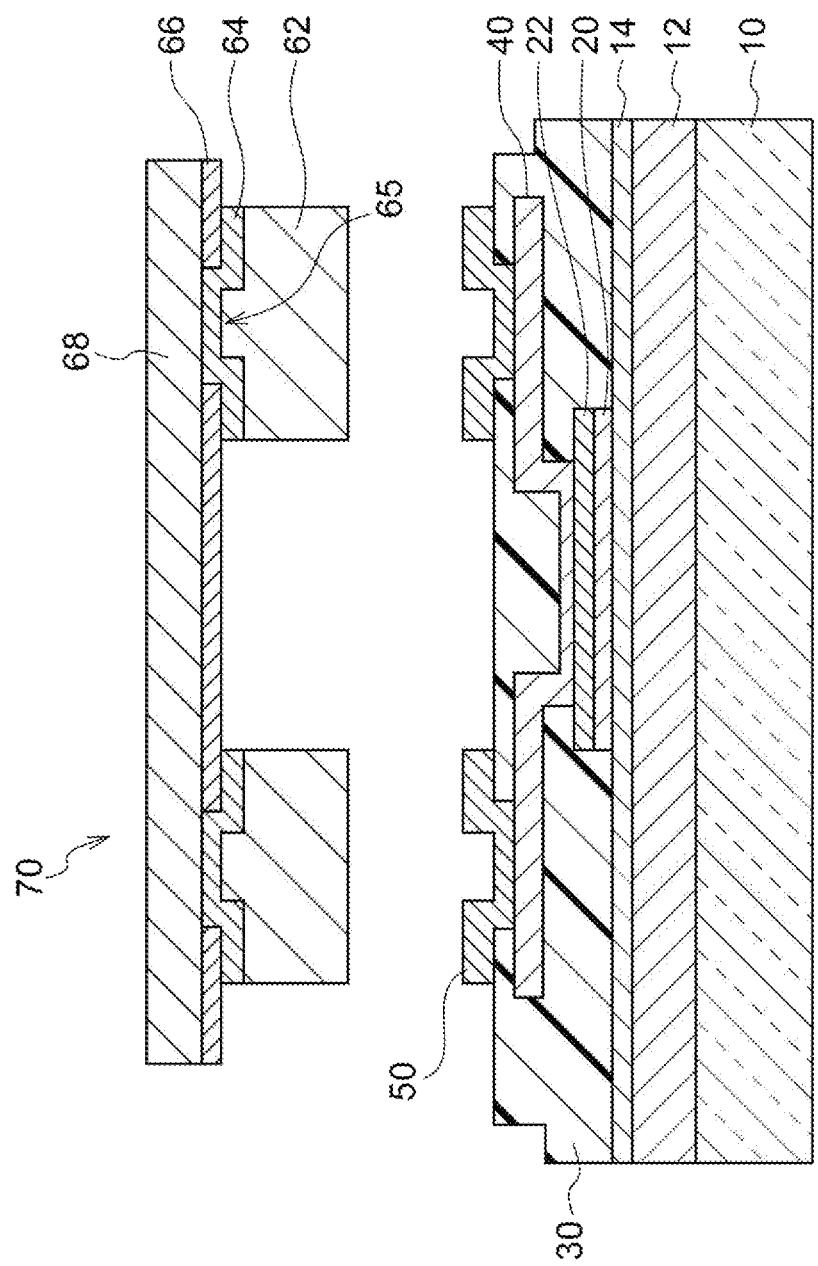
FIG. 9 is a cross-sectional view schematically illustrating an example of the method for manufacturing a semiconductor package according to the first embodiment of the disclosure.

Subsequently, a semiconductor element which is electrically connected to the Ni base 22 is disposed on a side of the temporary support 16 on which the foundation portion 20 and the Ni base 22 is formed. The semiconductor element used in the embodiment is not limited, and a desirable element such as an LSI chip or an IC chip can be used. For example, it is possible to use a semiconductor element 68 in which a circuit element such as a transistor, a resistance element, or a capacitor is formed on a semiconductor substrate and a flip chip 70 in which an insulating film 66 is formed as a protective film on a circuit element formation surface (FIG. 9). An opening portion 65 is formed at a part of the insulating film 66, and a Ni layer 64 having an effect of barrier metal as a bonding electrode which is electrically connected to the semiconductor element 68 and a connection solder terminal 62 configured of solder such as SnAg on the bonding electrode 64 are formed at the opening portion 65.

Figure 10:
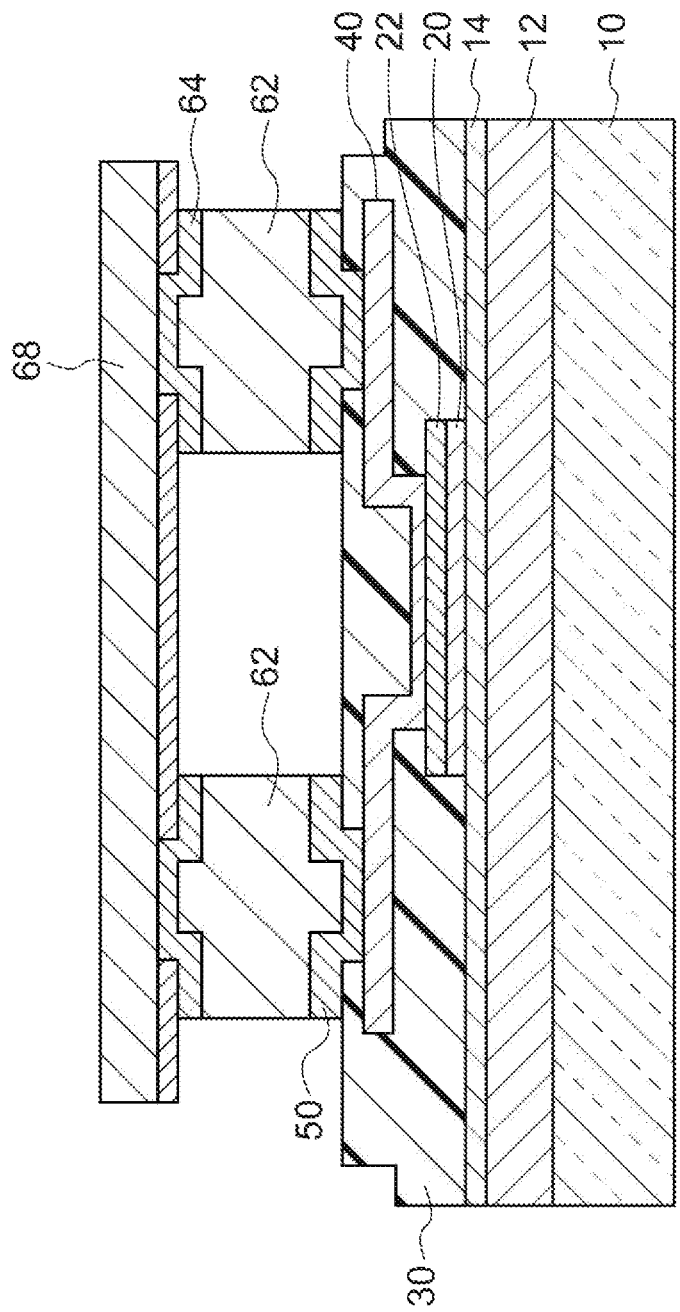
FIG. 10 is a cross-sectional view schematically illustrating an example of the method for manufacturing a semiconductor package according to the first embodiment of the disclosure.

The connection solder terminal 62 on a side of the flip chip 70 and the bonding electrode 50 on a side of the temporary support 16 come into close contact with each other by matching positions thereof and are bonded by applying heat and pressure (FIG. 10). Consequently, the semiconductor element 68 is electrically connected to the Ni base 22 via the connection solder terminal 62, the bonding electrodes 50 and 64, and the rewiring 40 after bonding and is disposed on the first insulating layer 30.

(Mold Sealing)

Figure 11:
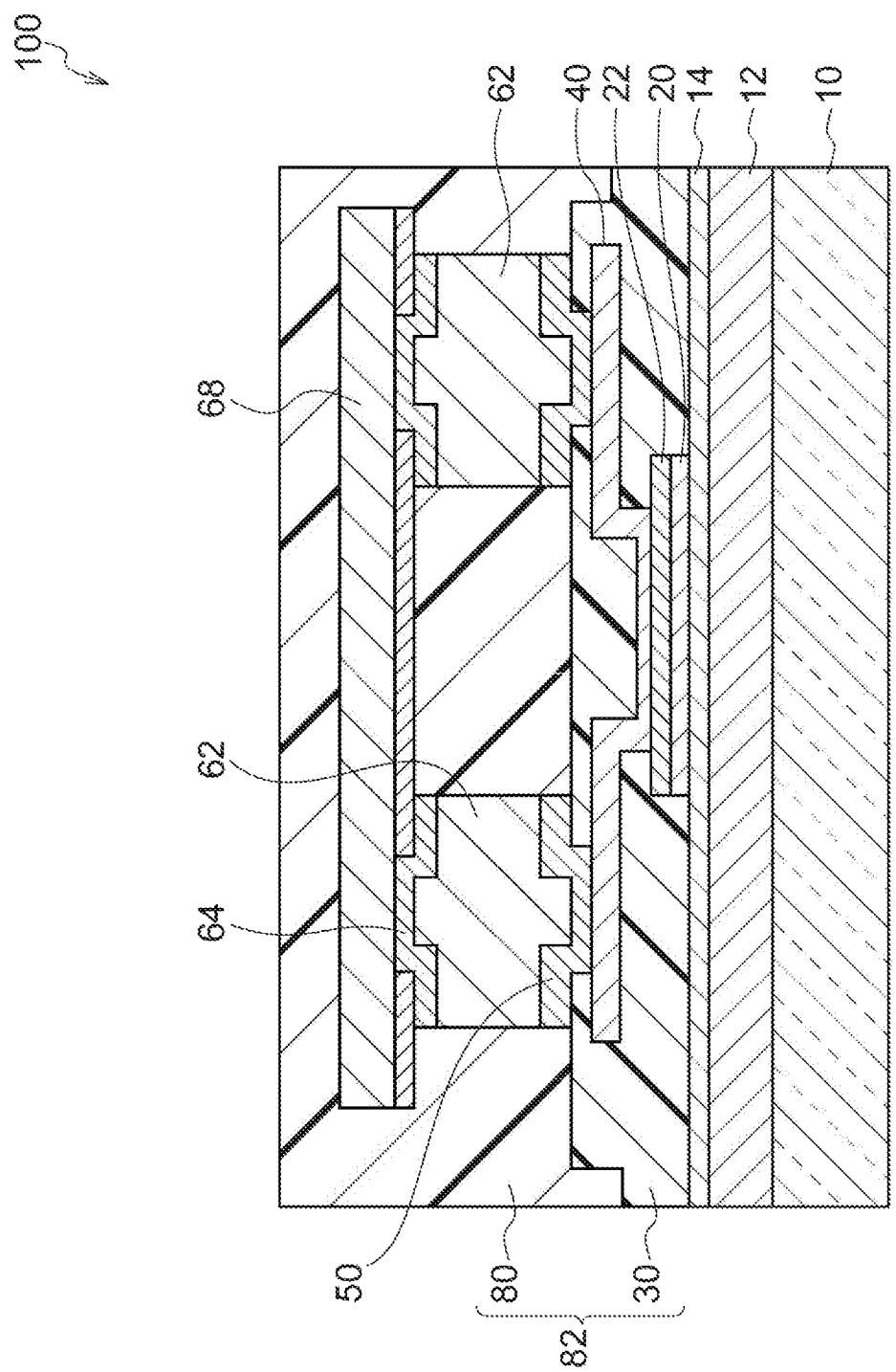
FIG. 11 is a cross-sectional view schematically illustrating an example of the method for manufacturing a semiconductor package according to the first embodiment of the disclosure.

After the Ni base 22 and the semiconductor element 68 are electrically connected to each other, a second insulating layer 80 coming into a state of burying the semiconductor element 68 by mold sealing with a thermosetting resin such as an epoxy resin is formed (FIG. 11). Consequently, the main semiconductor package body 100 is formed in which the seed layer 20, the Ni base 22, the rewiring 40, the bonding electrodes 50 and 64, the connection solder terminal 62, and the flip chip 70 are buried in an insulating layer 82 (the first insulating layer 30 and the second insulating layer 80).

(Removal of Temporary Support)

After performing the mold sealing, the temporary support 16 is removed, and thereby surfaces of the foundation portion 20 and the insulating layer 82 (the first insulating layer 30) on a side of the temporary support 16 are exposed.

Figure 12:
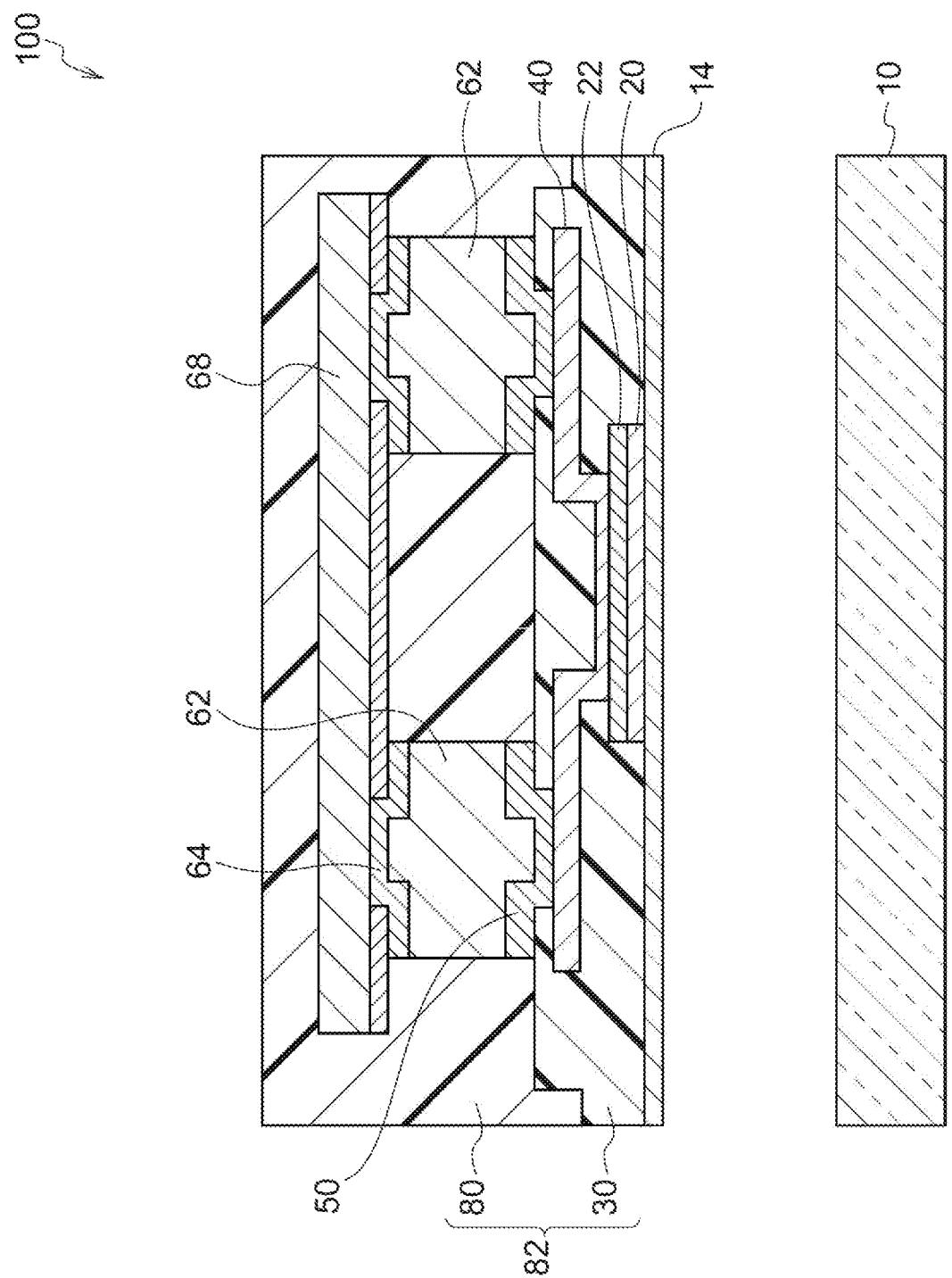
FIG. 12 is a cross-sectional view schematically illustrating an example of the method for manufacturing a semiconductor package according to the first embodiment of the disclosure.

First, the ultraviolet laser beam (for example, THG laser beam having a wavelength of 355 nm or longer) is irradiated from a side of the glass substrate 10 to separate the glass substrate 10 of the temporary support 16 from the main semiconductor package body 100 (FIG. 12). The temporary fixing layer 12 is decomposed by the ultraviolet laser beam transmitted through the glass substrate 10, the glass substrate 10 of the temporary support 16 is separated from the main semiconductor package body 100, and the protective layer 14 is in a state of being attached to the first insulating layer 30. Moreover, the protective layer 14 inhibits the ultraviolet laser beam from being transmitted toward a side of the main semiconductor package body 100, and it is possible to suppress a damage to the main semiconductor package body 100 caused by the ultraviolet laser beam.

After the glass substrate 10 is separated by irradiation of the ultraviolet laser beam, residues on the temporary fixing layer 12 on a side of the first insulating layer 30 are removed by cleaning.

Figure 13:
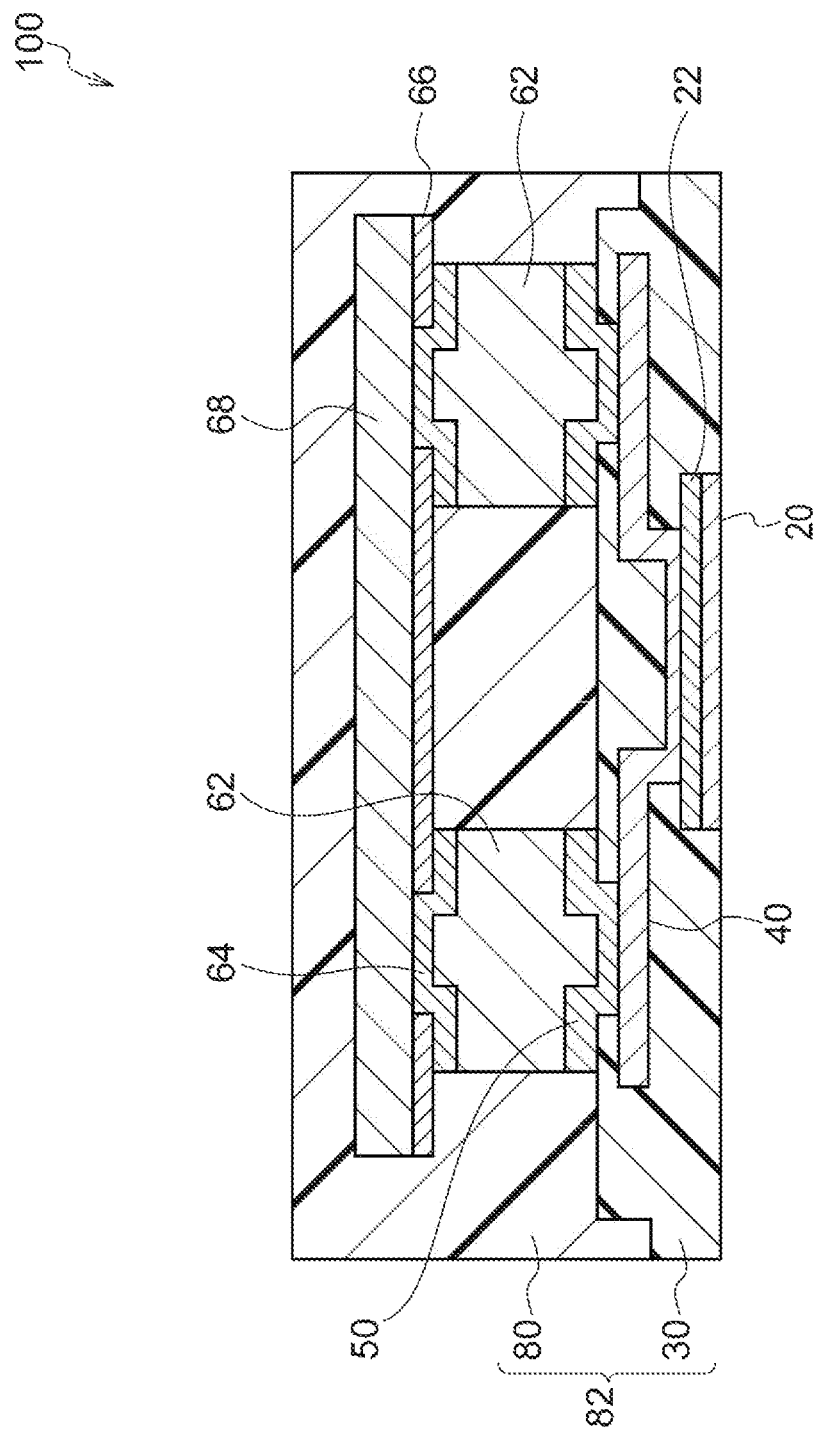
FIG. 13 is a cross-sectional view schematically illustrating an example of the method for manufacturing a semiconductor package according to the first embodiment of the disclosure.

After the separation of the glass substrate 10, the protective layer (Ti layer) 14 is further removed from the main semiconductor package body 100. For example, the protective layer (Ti layer) 14 is removed by using an alkaline chemical as an etching solution, and thereby surfaces of the seed layer 20 and the first insulating layer 30 which are in contact with the temporary support 16 (the protective layer 14) are exposed (FIG. 13).

(Removal of Seed Layer)

Figure 14:
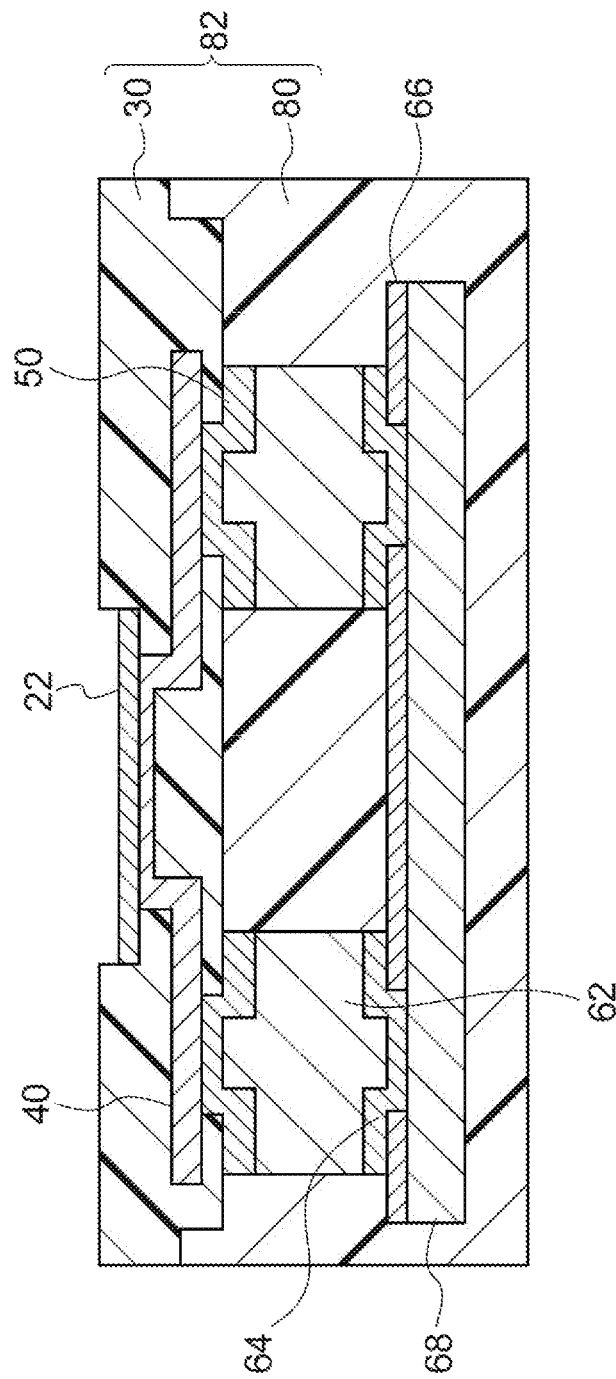
FIG. 14 is a cross-sectional view schematically illustrating an example of the method for manufacturing a semiconductor package according to the first embodiment of the disclosure.

Subsequently, the temporary support 16 is removed, and thereby the exposed seed layer 20 is removed (FIG. 14). For example, the seed layer 20 is etched by an acid chemical. Consequently, a side surface of the Ni base 22 and a surface of the Ni base 22 which is connected to the rewiring 40 are buried in the first insulating layer 30, and a surface of the Ni base on which the external connection terminal 110 is formed is exposed in a state of being more recessed than a surface (surface exposed by removing the temporary support 16) of the first insulating layer 30.

(Forming of External Connection Terminal)

Figure 15:
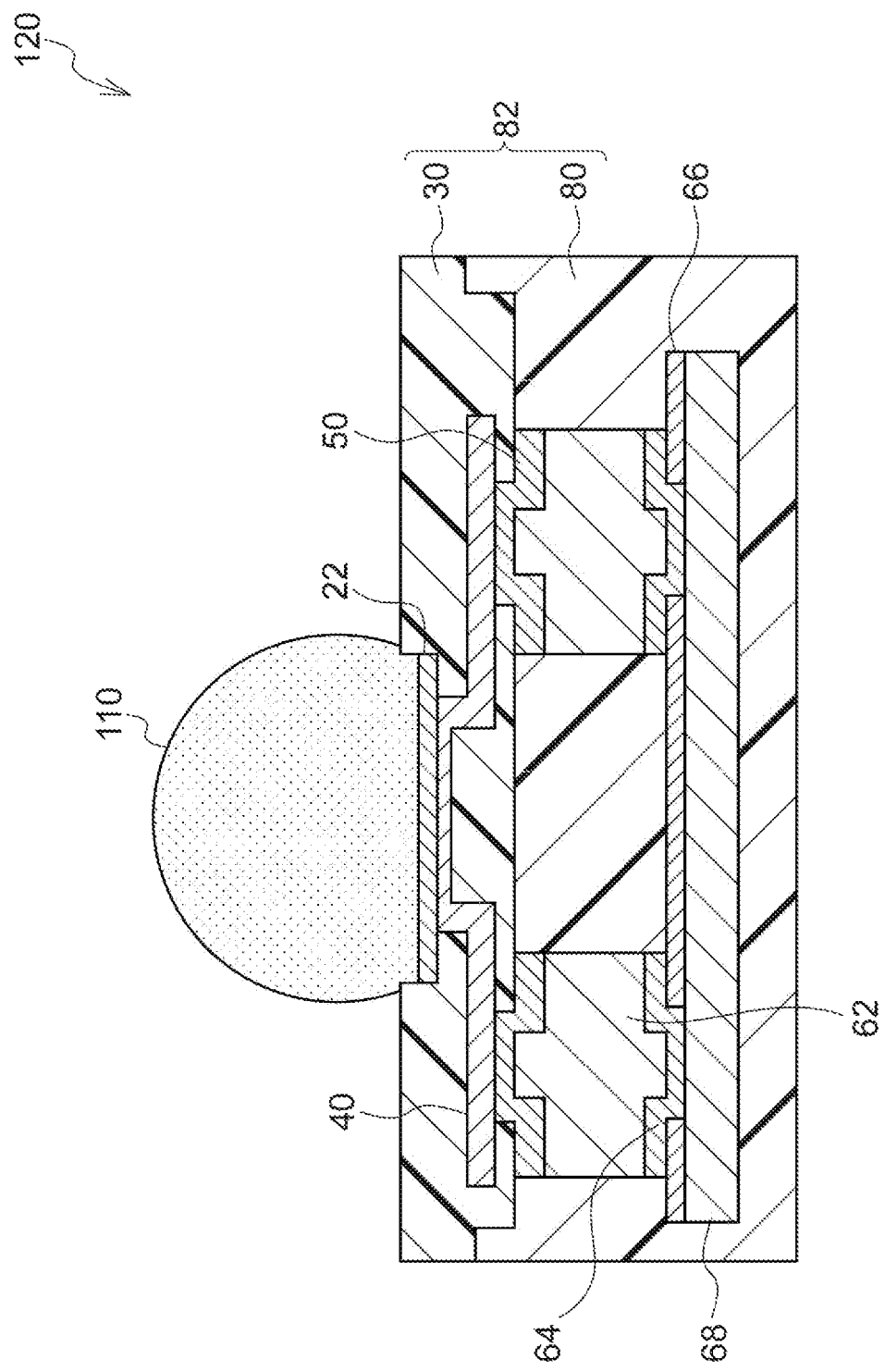
FIG. 15 is a cross-sectional view schematically illustrating an example of the method for manufacturing a semiconductor package according to the first embodiment of the disclosure.

The external connection terminal 110 is formed on the Ni base 22 exposed by removing the seed layer 20. For example, a solder ball is disposed on the Ni base 22 by a ball mounting method to form the external connection terminal 110 (FIG. 15).

Through the steps described above, a semiconductor package 120 according to the first embodiment is manufactured.

According to the method for manufacturing a semiconductor package of the first embodiment, the foundation portion 20 and the base portion 22 for forming the external connection terminal 110 are formed in advance on the temporary support 16, and the temporary support 16 and the foundation portion 20 are removed after the main semiconductor package body 100 is built, and thereby the base portion 22 is exposed in a state of being more recessed than the surface of the insulating layer 82. Hence, it is possible to easily manufacture the semiconductor package 120 without the necessity of forming, after the temporary support is removed, the base portion by electroless plating or forming an insulating layer on the insulating layer 82 (the first insulating layer 30) out of the region in which the external connection terminal 110 is formed.

In addition, since the side surface of the base portion 22 is buried in the first insulating layer 30 in a state that the surface of the base portion 22 on which the external connection terminal 110 is formed is more recessed than the first insulating layer 30, the manufactured semiconductor package 120 can have high connection strength of the external connection terminal 110.

[Semiconductor Package]

Next, the semiconductor package according to the embodiment is described.

The semiconductor package includes: an external connection terminal; a conductive base portion on which the external connection terminal is formed; a semiconductor element electrically connected to the base portion; and an insulating layer in which the base portion and the semiconductor element are buried. The base portion is buried in the insulating layer in a state that the surface of the base portion on which the external connection terminal is formed is more recessed than the surface of the insulating layer.

The insulating layer may include the first insulating layer in which the base portion is buried and the second insulating layer in which the semiconductor element is buried. The base portion may be buried in the first insulating layer in a state that the surface of the base portion on which the external connection terminal is formed is more recessed than the surface of the first insulating layer.

In the semiconductor package according to the embodiment, the side surface of the base portion is buried in the insulating layer, and the external connection terminal is formed on the surface being more recessed than the surface of the insulating layer, and thus the connection strength of the external connection terminal can be increased.

<Semiconductor Package According to First Embodiment>

Hereinafter, an example (first embodiment) of the semiconductor package according to the embodiment is described with reference to the drawings.

Figure 16:
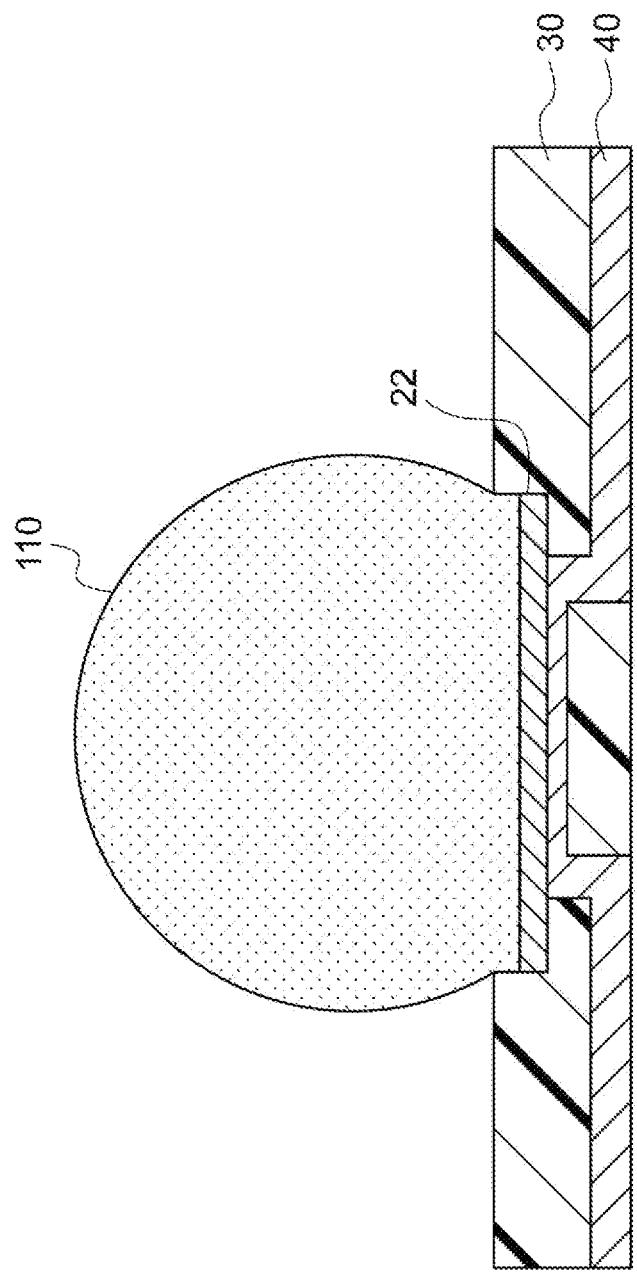
FIG. 16 is a view schematically illustrating an example of a connection part of a base portion and an external connection terminal in a semiconductor package according to the first embodiment of the disclosure.

The semiconductor package according to the embodiment can be manufactured by, for example, the method for manufacturing a semiconductor package according to the first embodiment described above, and has a configuration illustrated in FIG. 15. FIG. 16 is a schematic view illustrating an example of a connection part of the base portion and the external connection terminal in the semiconductor package according to the first embodiment.

The semiconductor package 120 according to the first embodiment includes a solder ball 110 which is an external connection terminal, the conductive base portion 22 on which the external connection terminal 110 is formed, the first insulating layer 30 in which the base portion 22 is buried, the semiconductor element 68 electrically connected to the base portion 22, and the second insulating layer 80 in which the semiconductor element 68 is buried. The base portion 22 is buried in the first insulating layer 30 in a state that the surface of the base portion on which the external connection terminal 110 is formed is more recessed than the surface of the first insulating layer 30.

In the semiconductor package 120 according to the first embodiment, the side surface of the base portion 22 is buried in the first insulating layer 30 in a state that the surface of the base portion on which the external connection terminal 110 is formed is more recessed than the first insulating layer 30, and thus the connection strength of the external connection terminal 110 can be increased.

Moreover, the external connection terminal is not limited to the solder ball, and the external connection terminal can employ a known conductive material and formation method.

Figure 17:
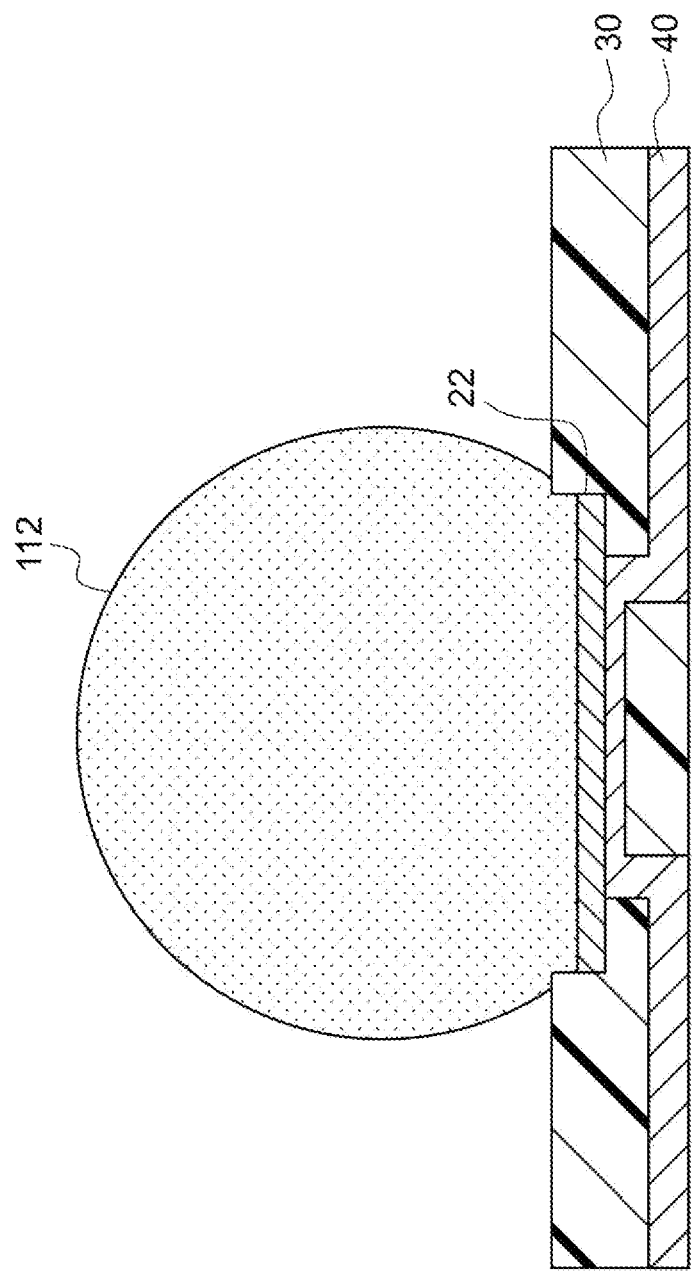
FIG. 17 is a view schematically illustrating an example of the connection part of the base portion and the external connection terminal in the semiconductor package according to the first embodiment of the disclosure.

For example, as illustrated in FIG. 17, a solder ball 112 disposed on the base portion 22 and even on the first insulating layer 30 around the base portion 22 may be arranged as the external connection terminal. When the solder ball 112 is disposed in a state of being mounted even on the first insulating layer 30 having a step around the base portion 22 as described above, the solder ball 112 is supported by the first insulating layer 30 having a step around the base portion 22, in addition to being connected to the base portion 22, and the connection strength of the external connection terminal can be further increased.

Second Embodiment

In the first embodiment, a case in which the first insulating layer in which the base portion is buried and the second insulating layer in which the semiconductor element is buried are formed as the insulating layer is described; however, the base portion and the semiconductor element may be buried in one insulating layer.

FIGS. 18 to 23 illustrate a method for manufacturing a semiconductor package in which the base portion and the semiconductor element are buried in the same insulating layer.

Figure 18:
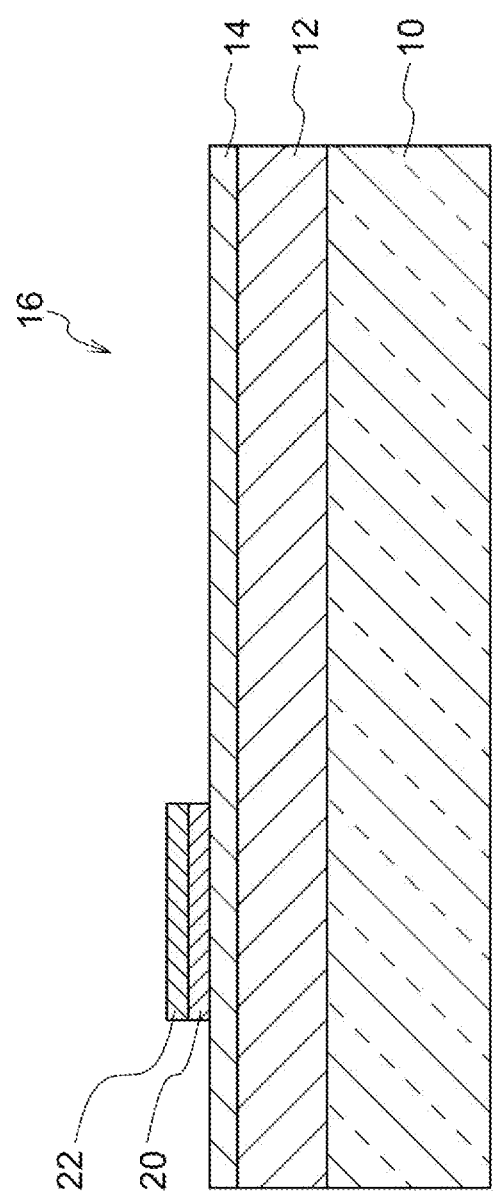
FIG. 18 is a cross-sectional view schematically illustrating an example of a method for manufacturing a semiconductor package according to a second embodiment of the disclosure.

First, similarly to the first embodiment, the foundation portion 20 and the base portion 22 are formed on the temporary support 16 (FIG. 18).

Figure 19:
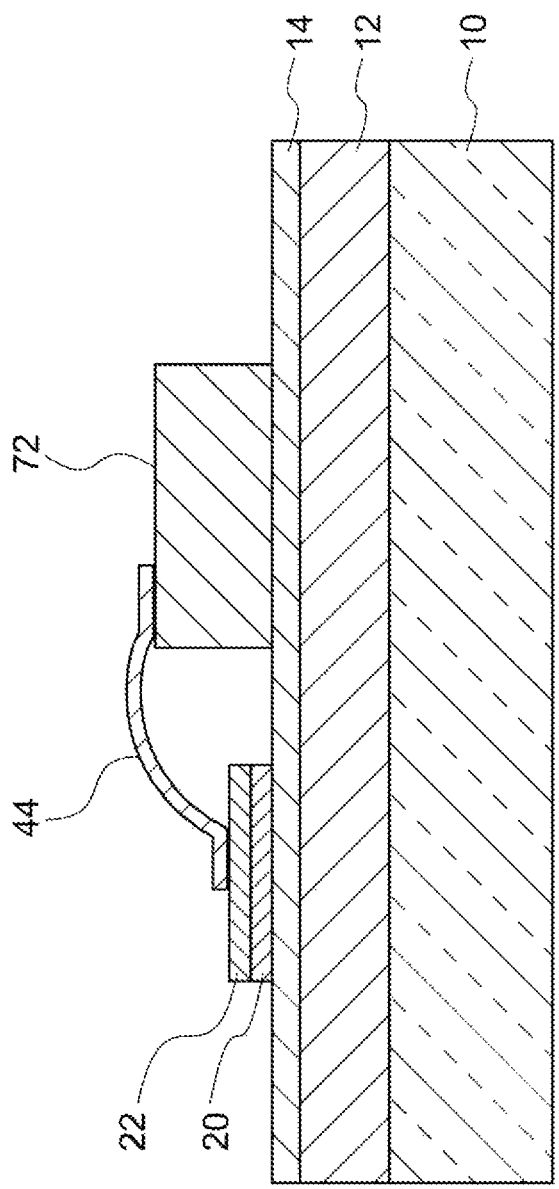
FIG. 19 is a cross-sectional view schematically illustrating an example of the method for manufacturing a semiconductor package according to the second embodiment of the disclosure.

Subsequently, a semiconductor element 72 is disposed on the temporary support 16, and a rewiring 44 is formed to electrically connect the base portion 22 and the semiconductor element 72 to each other (FIG. 19).

Figure 20:
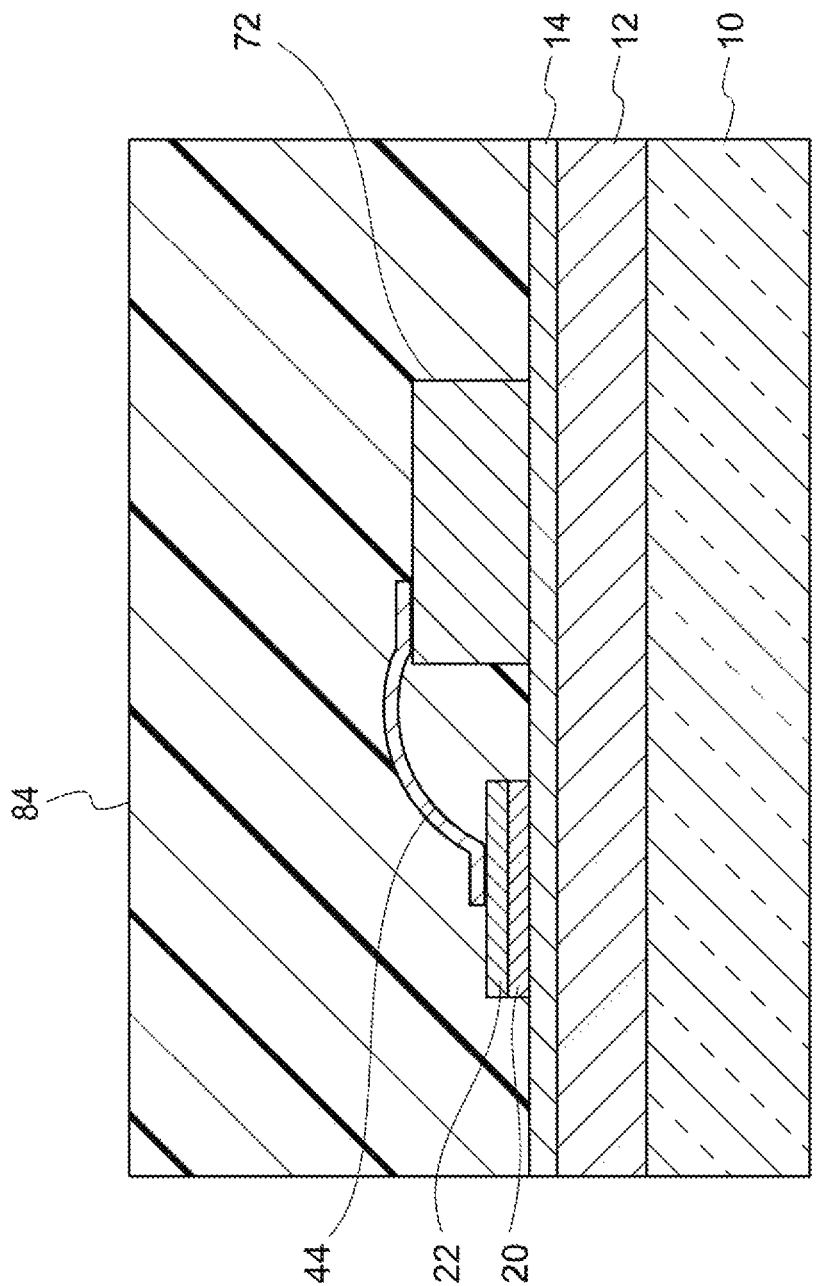
FIG. 20 is a cross-sectional view schematically illustrating an example of the method for manufacturing a semiconductor package according to the second embodiment of the disclosure.

Then, mold sealing is performed with a thermosetting resin such as an epoxy resin (FIG. 20). Consequently, the foundation portion 20, the base portion 22, the rewiring 44, and the semiconductor element 72 are buried, and an insulating layer 84 which is in contact with the temporary support 16 is formed in a region in which the foundation portion 20 and the semiconductor element 72 are not disposed.

Figure 21:
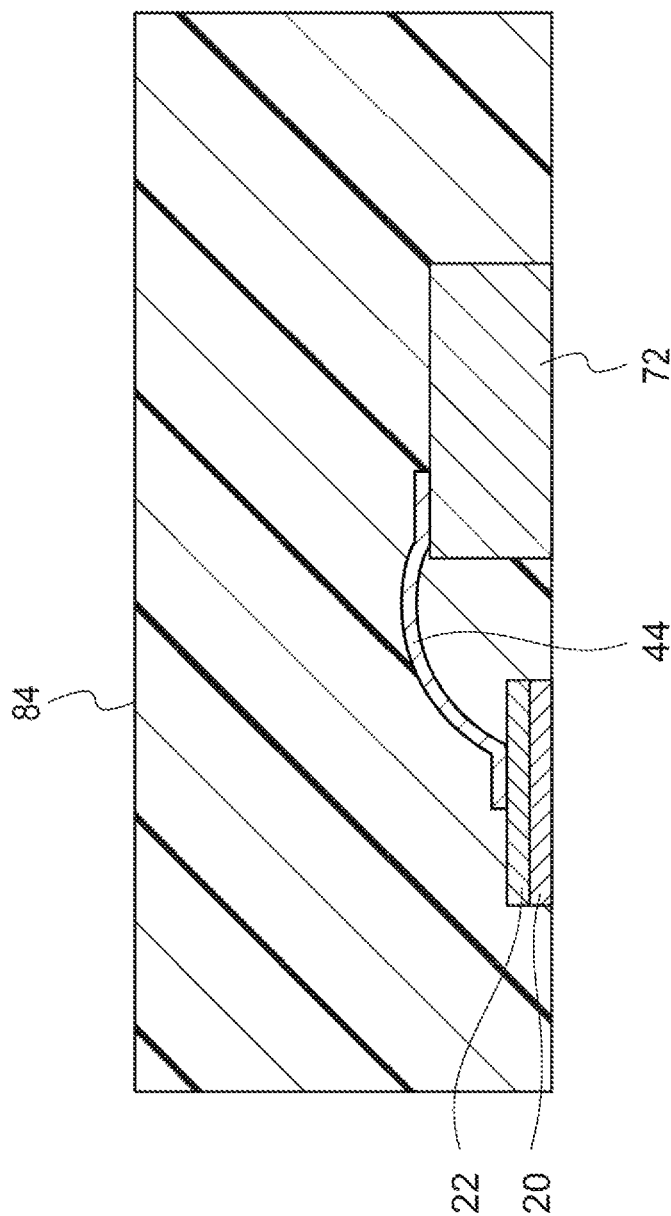
FIG. 21 is a cross-sectional view schematically illustrating an example of the method for manufacturing a semiconductor package according to the second embodiment of the disclosure.

After the mold sealing is performed, the temporary support 16 is removed in the same manner as that in the first embodiment (FIG. 21).

Figure 22:
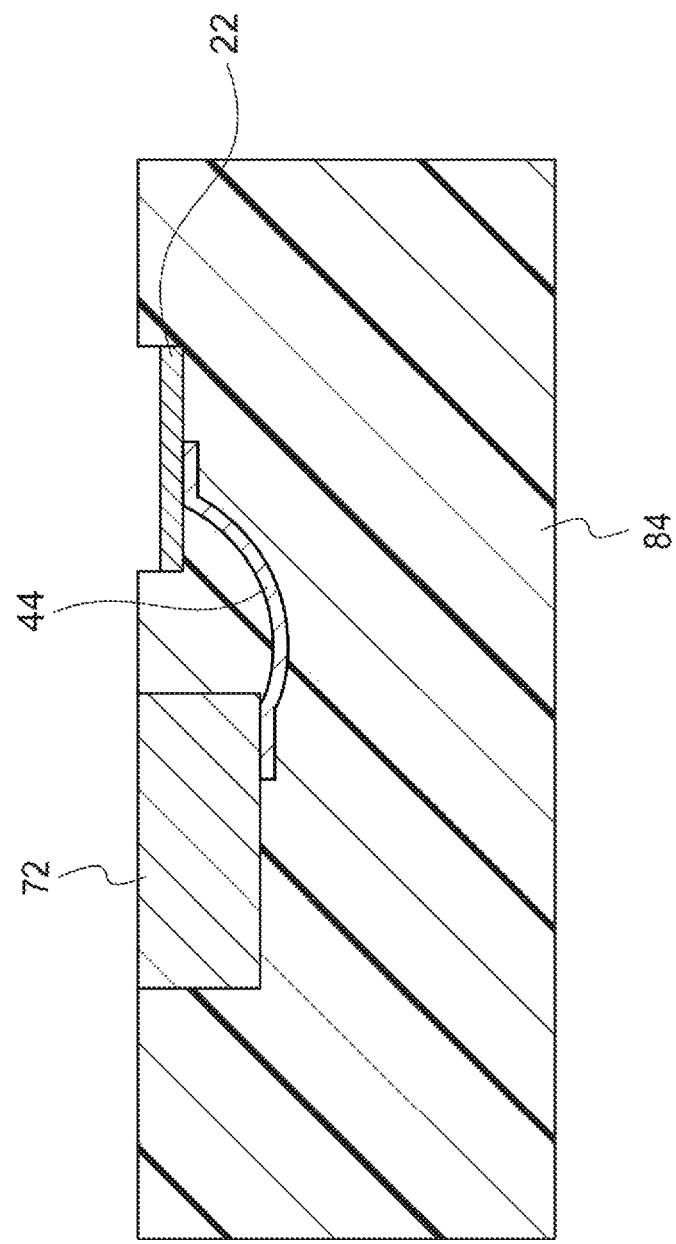
FIG. 22 is a cross-sectional view schematically illustrating an example of the method for manufacturing a semiconductor package according to the second embodiment of the disclosure.
Figure 23:
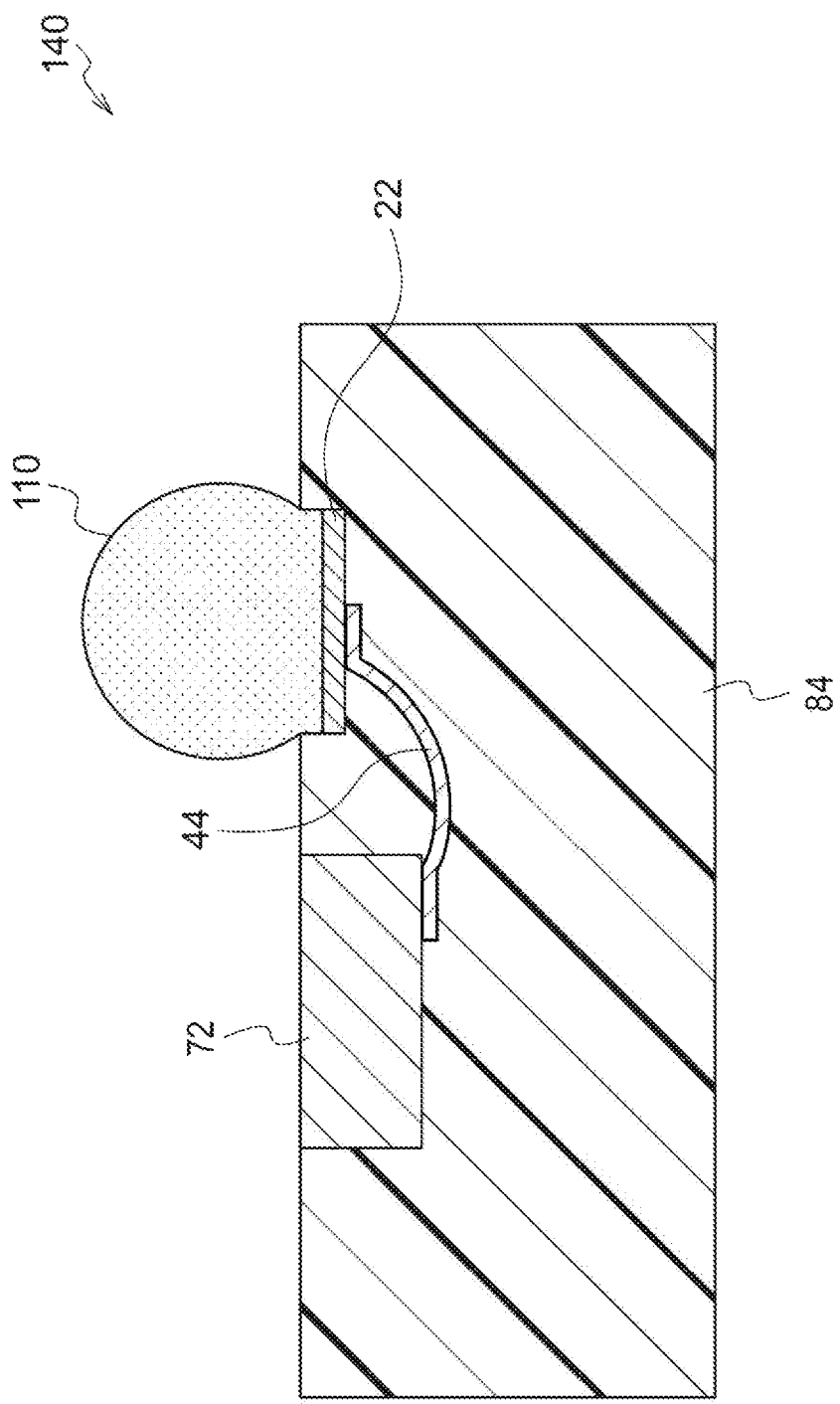
FIG. 23 is a cross-sectional view schematically illustrating an example of the method for manufacturing a semiconductor package according to the second embodiment of the disclosure.
Figure 24:
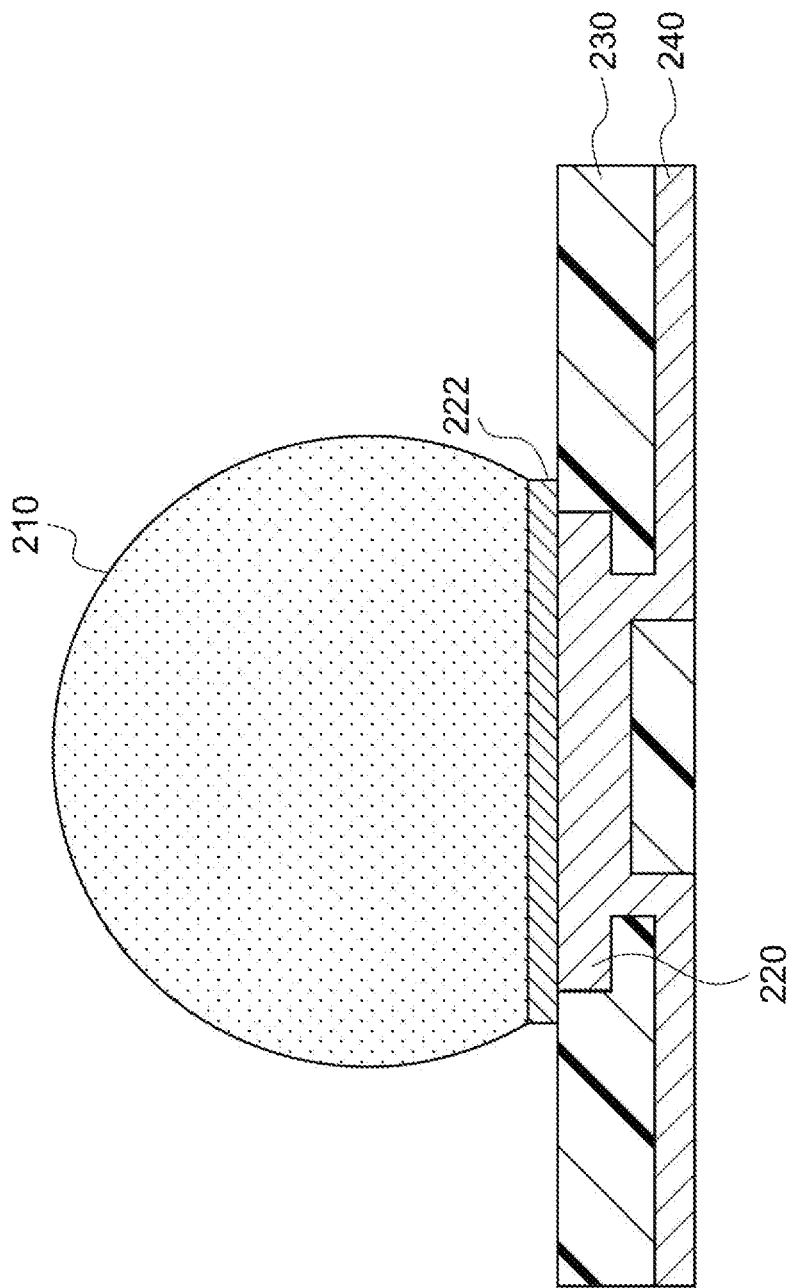
FIG. 24 is a schematic view illustrating an example of a connection part of a base portion and an external connection terminal in a conventional semiconductor package.

Further, the exposed foundation portion 20 is removed by etching (FIG. 22). Consequently, a side surface the base portion 22 is buried in the insulating layer 84, and a surface of the base portion 22 on which the external connection terminal is formed is exposed in a state of being more recessed than a surface (surface exposed by removing the temporary support 16) of the insulating layer 84.

Then, a solder ball is mounted on the exposed base portion 22 to form the external connection terminal 110.

Through the steps described above, a semiconductor package 140 according to the second embodiment is manufactured in which the base portion 22 and the semiconductor element 72 are buried in the same insulating layer 84.

According to the method for manufacturing a semiconductor package of the second embodiment, the foundation portion 20 and the base portion 22 for forming the external connection terminal 110 are formed in advance on the temporary support 16, and the temporary support 16 and the foundation portion 20 are removed after the main semiconductor package body 100 is built by disposing the semiconductor element 72, forming the rewiring 44, and forming the insulating layer 84 by resin sealing, and thereby the base portion 22 is exposed in a state of being more recessed than the surface of the insulating layer 84. Hence, it is possible to easily manufacture the semiconductor package 140 without the necessity of forming, after the temporary support 16 is removed, the base portion by electroless plating or forming an insulating layer on the insulating layer 84 out of the region thereof in which the external connection terminal 110 is formed.

In addition, in the manufactured semiconductor package 140, the side surface of the base portion 22 is buried in the insulating layer 84 in a state that the surface of the base portion 22 on which the external connection terminal 110 is formed is more recessed than the insulating layer 84, and thus the connection strength of the external connection terminal 110 can be increased.

Examples of the method for manufacturing a semiconductor package and the semiconductor package according to the disclosure are described above; however, the method for manufacturing a semiconductor package and the semiconductor package according to the disclosure are not limited to the embodiments.

For example, in the embodiments, a case in which the base portion is formed by electrolytic plating is described; however, the disclosure is not limited hereto. For example, the base portion may be formed by a deposition method such as a sputter method. In addition, the base portion and the foundation portion may be formed by sequentially forming a foundation layer which becomes the foundation portion and a conductive layer which becomes the base portion on the temporary support such that the foundation layer and the conductive layer are stacked, then forming the resist mask in a predetermined region on the conductive layer, and sequentially removing the conductive layer and the foundation layer in a region in which the resist mask is not formed.

In addition, the material configuring the semiconductor package, the shape, the thickness, and the like may be appropriately set. For example, the structural material of the base portion and the bonding electrode is not limited to Ni and may be formed by metal having the effect of barrier metal such as Ta or TaN. In addition, the material of the rewiring is not limited to Cu and a known material such as Al which is used as wiring can be used.

According to the disclosure, there are provided a method for manufacturing a semiconductor package by which it is possible to easily manufacture the semiconductor package including an external connection terminal having high connection strength by using a temporary support and a semiconductor package in which it is possible to increase connection strength of the external connection terminal.

What is claimed is:

1. A method for manufacturing a semiconductor package, comprising:
    a step of providing a temporary support including a protective layer stacked on a glass substrate;
    a step of forming a foundation layer for forming a foundation portion on the protective layer;
    a step of forming, on the foundation layer, a resist mask having a region for forming a conductive base portion which is open;
    a step of forming the base portion in the open region of the resist mask on the foundation layer;
    a step of removing the resist mask;
    a step of forming the foundation portion by etching, with the base portion as a mask, a region of the foundation layer in which the base portion is not formed;
    a step of disposing a semiconductor element on the protective layer, wherein a second surface of the semiconductor element is in direct contact with the protective layer and a first surface of the semiconductor element is exposed;
    a step of attaching a wiring between the first surface of the semiconductor element and the base portion to electrically connect the semiconductor element to the base portion;
    a step of forming an insulating layer coming into a state of burying the semiconductor element, the wiring, the foundation portion and the base portion, after the step of attaching the wiring between the first surface of the semiconductor element and the base portion to electrically connect the semiconductor element electrically to the base portion;
    a step of removing the glass substrate to expose the protective layer;
    a step of exposing, by removing the protective layer, surfaces of the foundation portion and the insulating layer on a side of the protective layer, and a second surface of the semiconductor element;
    a step of exposing, by removing the exposed foundation portion, the base portion in a state of being more recessed than the surface of the insulating layer; and
    a step of forming an external connection terminal on the exposed base portion.

2. The method for manufacturing a semiconductor package according to claim 1,
    wherein the step of forming the foundation portion and the base portion on the temporary support includes a step of forming the base portion by electrolytic plating.

3. The method for manufacturing a semiconductor package according to claim 1,
    wherein the step of forming the foundation portion and the base portion on the temporary support includes a step of forming the base portion including Ni by electrolytic plating.

* * * * *